July 16, 1963

J. A. AMICK ETAL 3,097,977

SEMICONDUCTOR DEVICES

Filed June 1, 1961

INVENTORS
JAMES A. AMICK &
GLENN W. CULLEN

W.S. Hill
AGENT

United States Patent Office 3,097,977
Patented July 16, 1963

3,097,977

SEMICONDUCTOR DEVICES

James A. Amick and Glenn W. Cullen, Princeton, N.J., assignors to Radio Corporation of America, a corporation of Delaware Filed June 1, 1961, Ser. No. 114,067
11 Claims. (Cl. 148—6.14)

Figures 1, 2, 3, 4:
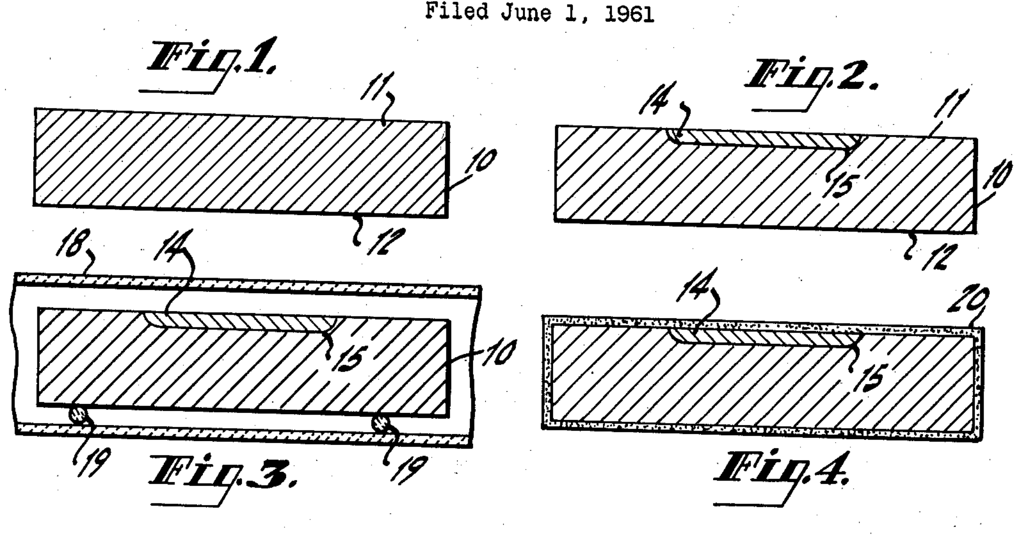

This invention relates to improved semiconductor devices and improved methods of fabricating them. More particularly, this invention relates to improved methods of controlling and stabilizing the surface characteristics of semiconductor devices so as to stabilize their electrical characteristics, and the improved semiconductor devices made by said improved methods.

Semiconductor devices generally consist of a wafer of crystalline semiconductive material such as germanium, silicon, germanium-silicon alloys, and the like, with at least two electrical leads connected to the wafer. Examples of such devices which include a rectifying junction are the two-terminal units such as conventional diodes, tunnel diodes, PNPN diodes, and parametric or variable capacitance diodes; three-terminal units such as bipolar transistor triodes and unipolar transistors; and four-terminal units such as tetrodes. A common characteristic of such devices, whether fabricated by surface alloying, diffusion, grown junction, epitaxial or other techniques, is a slow irreversible change in the electrical parameters of the device. This change is believed to be due to changes in the nature of the surface characteristics of the semiconductor, and particularly seems to be associated with exposure of the device to moisture and oxygen. For a discussion of semiconductor surface characteristics and their effects on semiconductor devices, see chapter 16, "Semiconductor Surfaces," by J. T. Law, in "Semiconductors," edited by N. B. Hannay, Reinhold Publishing Company, New York, 1959; also "Semiconductor Surface Physics," edited by R. H. Kingston, University of Pennsylvania Press, Philadelphia, 1957.

Since such irreversible changes of semiconductor device parameters are generally in the direction of degrading the electrical performance of the device, and variable performance per se is undesirable in a circuit element, it is customary in the art to employ various special procedures in order to reduce or ameliorate this slow deterioration of semiconductor devices. One technique utilized for this purpose consists of potting the device in a mass of plastic. Another ameliorative technique consists of hermetically sealing the device in a metal case, while maintaining a dry inert atmosphere within the case. Although these techniques have been useful, they have not completely stabilized or controlled the surface characteristics of the semiconductor device, and have not prevented the slow degradation of electrical device parameters.

Some attempts have been made to control the surface characteristics of a semiconductor device by chemical or electrolytical etching of the semiconductive wafer. When a crystalline semiconductor such as germanium, silicon, germanium-silicon alloys and the like is etched and subsequently exposed to air, the surface of the semiconductor is covered with at least a monomolecular layer of oxygen atoms. Some water, some etchant constituents, and some of the impurities present in the etchant are also left on the surface of the semiconductor wafer, as well as reaction products of the semiconductor and the etchant. Although the use of particular etchants in semiconductor device production tends to give improved uniformity of electrical characteristics, the general problems of slow deterioration of electrical characteristics and sensitivity to moisture and atmospheric constituents remain. Similarly, attempts to control the surface characteristics of a semiconductor wafer by partial oxidation of the surface have resulted in improved stabilization of the wafer electrical characteristics, but have not completely solved these problems.

Attempts have also been made to protect and stabilize the surface of a semiconductor wafer by bonding organic radicals to the oxide layer on the wafer surface. This modification while an improvement over the prior art, does not result in long term stability at high humidity and advanced temperatures.

Accordingly, it is an object of this invention to provide an improved method of fabricating improved semiconductor devices.

Another object of the invention is to provide improved methods of controlling the surface characteristics of semiconductor devices.

But another object of the invention is to provide improved semiconductor devices having improved surface characteristics.

These and other objects and advantages are attained according to the invention in crystalline semiconductive wafers consisting of a material selected from the group consisting of germanium, silicon, and germanium-silicon alloys. It has now been found that the variation of the surface characteristics of a wafer of the aforesaid semiconductive materials may be controlled by first activating the surface of the wafer, and then treating the wafer with a reactive alkylating agent. Activation of the wafer surface may be accomplished by such procedures as halogenation. The reactive alkylating agents include organometallic compounds such as alkali metal alkyls and alkyl magnesium halides or Grignard reagents. Advantageously, the semiconductor wafer is alkylated until there is approximately a 1:1 ratio between the number of semiconductor atoms per unit wafer surface area and the number of alkyl groups chemically bonded to said wafer per unit surface area.

Figure 5:
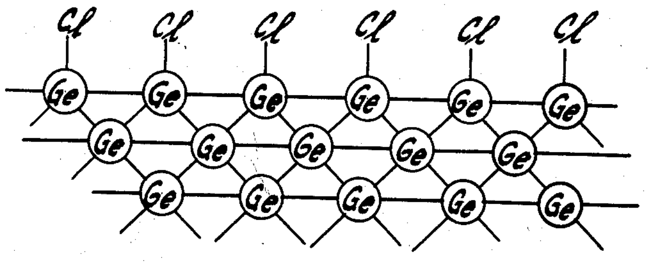
Figure 6:
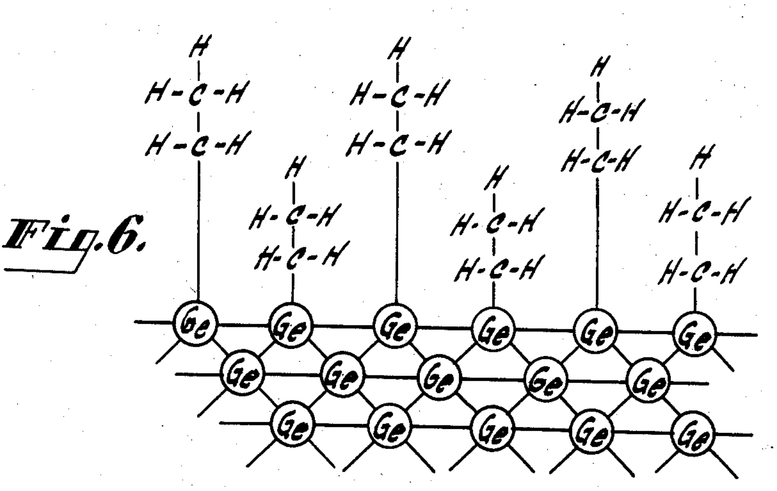

The invention will be described in greater detail in conjunction with the accompanying drawing, in which:

FIGURES 1–4 are elevational cross-sectional views of successive steps in the fabrication of a semiconductor device in accordance with the invention; and, FIGURES 5 and 6 are schematic diagrams of a semiconductor wafer and its surface useful in explaining the invention.

The invention will be described by means of some specific examples of device fabrication. Although these examples recite the fabrication of semiconductor rectifying diodes, it will be understood that semiconductor wafers treated according to the invention may be utilized to make other types of two-terminal devices, as well as three-terminal and four-terminal semiconductor devices.

*Example I*

Referring now to FIG. 1, a semiconductor wafer 10 of given conductivity type is prepared with two opposing major [111] faces 11 and 12. The wafer 10 consists of a crystalline semiconductive material selected from the group consisting of germanium, silicon, and germanium-silicon alloys, and may be of either P-type or N-type conductivity. In this example, wafer 10 consists of P-type germanium.

A zone 14 of conductivity type opposite that of the original wafer is formed in the wafer adjacent one major face 11. The zone 14 may be formed by techniques known to the art, such as diffusion. In this example, since the wafer 10 was originally P-type, the surface zone 14 is made N-type by diffusion of a suitable donor, such as arsenic, antimony, and the like. A P-N junction 15 is thus formed between the N-type surface zone 14 and the P-type remaining bulk of wafer 10, as shown in FIG. 2.

The wafer 10 is now chemically cleaned by utilizing a mild etchant to remove a thin layer from the surface of the wafer. A suitable mild etchant for the germanium wafer of this example consists of 30% hydrogen peroxide saturated with oxalic acid. The etchant used is preferably free of ions, such as sodium ions or fluoride ions, which are strongly adsorbed on a germanium surface. In this example, the wafer 10 is etched for a suitable time, e.g. three to five minutes at 70° C. in the acidic hydrogen peroxide solution.

The surface of the semiconductor wafer 10 is then activated. Conveniently, this may be accomplished by halogenating the wafer surface. In this example, the wafer 10 is supported in a quartz furnace tube 18 by quartz rods 19, as shown in FIG. 3. The wafer is first dried by passing a stream of a purified inert gas, such as nitrogen or argon, through furnace tube 18 for about fifteen minutes while maintaining the semiconductor wafer 10 at a temperature of about 130° C. The temperature of furnace tube 18 is then lowered to about 85° C., and a stream of equal parts by volume of hydrogen chloride and chlorine gas is passed through the furnace tube for about ten minutes. The wafer 10 is dried a second time by passing a stream of an inert gas such as nitrogen or argon through furnace tube 15 for about ten minutes while maintaining the temperature of the wafer at about 130° C. The temperature of the wafer is then lowered to 85° C. again, and a stream of equal parts by volume of hydrogen chloride and chlorine gas is passed through the furnace tube for about ten minutes. The wafer is then cooled to room temperature while passing a stream of inert gas through the furnace tube. As a result of this treatment, it is believed that each surface semiconductor atom of the semiconductor wafer is now bonded to a chlorine atom, as shown in FIG. 5, and hence the surface of wafer 10 is activated. The horizontal lines in FIG. 5 represent the crystal planes. Each germanium atom in the bulk of the crystal is bonded tetrahedrally to four neighboring germanium atoms.

The activated semiconductor wafer is then immersed without intermediate exposure to air in a reactive organic alkylating agent such as an alkali metal alkyl of the general formula MR, where M is an alkali metal such as lithium, sodium, potassium, and R is an organic radical, such as an alkyl group of the methyl, ethyl, propyl, isopropyl, and butyl series. Other reactive organic alkylating agents which are useful for this purpose are the Grignard reagents of the type RMgX, where X is a member of the halogen group consisting of chlorine, bromine, and iodine, while R is an organic radical such as an alkyl group. In this example, the activated wafer is immersed in ethyl magnesium bromide. A reaction takes place between the Grignard reagent and the chlorinated surface of the semiconductor wafer which results in the formation of magnesium bromide and magnesium chloride. The reaction between ethyl magnesium bromide and the germanium wafer 10 may be represented as

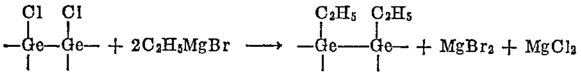

In the above equation, it is to be understood that the free bonds shown on the germanium atoms are directed to the other germanium atoms in the wafer. At the same time an alkyl group, in this example an ethyl group, is directly bonded to each germanium atom on the surface, as shown in FIGURE 6. Since each semi-conductor atom on the surface of the wafer had previously been bonded to a halogen atom, specifically to a chlorine atom in this example, the ratio between the number of semiconductor atoms per unit of wafer surface area and the number of alkyl groups chemically bonded to said wafer per unit surface area is approximately 1:1.

The wafer 10 is then rinsed in a dilute aqueous solution of ammonium chloride or acetic acid to remove magnesium salts and excess alkylating reagent from the wafer surface. The wafer 10 is then washed in distilled water, and finally dried in an air blast.

As shown in FIG. 4, this process results in the formation of a protective layer 20 of alkyl groups (ethyl groups in this example) over the surface of wafer 10. To complete the device, ohmic or non-rectifying connections are made to the given conductivity type and the opposite conductivity type zone 14 of the wafer by any convenient method known to the art preferably avoiding temperatures above 200° C. The unit is then encapsulated and cased by standard methods of the semiconductor art.

Improved reproducibility and stability of device characteristics are attained by the practice of the instant invention. These are believed due to the control and stabilization of the semiconductor wafer surface. It is known that in semiconductor devices the portion of the P-N junction or rectifying barrier which intercepts the surface of the semiconductor wafer is particularly sensitive to the influence of moisture and other constituents of the atmosphere. It will be noted that in the semiconductor wafer 10 treated according to the invention as shown in FIG. 4, the entire exposed surface of wafer 10, and particularly the portion of the rectifying barrier 15 which intercepts the surface of wafer 10, is completely covered and protected by the layer 30 of alkyl radicals. However, the practice of this invention is not dependent upon the particular theory selected to explain the improved characteristics of the semiconductor devices fabricated according to the invention.

It will be understood that various modifications of the procedure described above may be made without departing from the spirit and scope of the instant invention. For example, the mixture utilized to activate the semiconductor wafer surface may be bromine and hydrogen bromide instead of chlorine and hydrogen chloride. Similarly, the halide portion of the Grignard reagent may be a chloride or an iodide instead of a bromide. The choice of the particular halogen is dependent upon cost and availability, but those skilled in the art will also understand that the reaction rates of chlorides, bromides, and iodides are in general different.

It is believed that for complete control and stabilization of the wafer surface characteristics, it is necessary that every semiconductor atom on the wafer surface be bonded to an alkyl group. Such complete alkylation of the surface of a semiconductive wafer is difficult to obtain if the wafer itself is treated with the alkylating agent. However, if the wafer surface is first activated as described herein, for example by bonding a chlorine atom to each semiconductor atom on the wafer surface, it is possible to obtain a 1:1 ratio between the number of semiconductor atoms per unit of wafer surface area and the number of alkyl groups bonded to said wafer per unit surface area. Radiotracer studies of semiconductor wafers treated according to the invention but utilizing radioactive ethyl radicals have been made. The study results are consistent with a 1:1 ratio of alkyl groups to semiconductor surface atoms.

Although the organic radicals utilized in the examples described herein have all been simple aliphatic alkyl radicals, more complex organic radicals, including substituted groups and unsaturated groups may similarly be bonded to the semiconductor atoms on the wafer surface. In each case, the organic radical is bonded to the semiconductor atom on the wafer surface by a direct bond between the semiconductor atom and a carbon atom of the organic radical. When large or branched chain organic radicals are utilized, the effect of steric hindrance may become important, and may prevent the bonding of an organic radical to each semiconductor atom on the wafer surface. This effect should be avoided. Similarly, the use of organic radicals which are so unsaturated or substituted with active groups as to make the compound between the semiconductor atom and the organic radical unstable should be avoided.

*Example II*

In this example, a germanium wafer is activated by halogenation as described above in Example I, utilizing either chlorine and hydrogen chloride gas or bromine and hydrogen bromine. Thereafter the activated wafer is immersed in a reactive organic alkylating agent, which in this example consists of lithium propyl. A reaction takes place between the lithium propyl and the chlorinated surface of the semiconductor wafer which results in the formation of lithium chloride. At the same time an alkyl group, in this example a propyl group, is directly bonded to each germanium atom on the surface of the semiconductor wafer. The wafer is subsequently washed in distilled water, dried, and encapsulated as described above. The protective layer 20 of propyl groups over the surface of wafer 10 serves to stabilize the electrical characteristics of the device and make the unit essentially insensitive to ambient changes.

*Example III*

In this example, the semiconductive wafer consists of silicon. The surface of the silicon wafer is activated with a mixture of chlorine and hydrogen chloride or a mixture of bromine and hydrogen bromide as described above in Example I, utilizing temperatures appropriate for silicon. Each silicon atom on the surface of the wafer is thereby bonded to a halogen atom. The wafer is then immersed in a reactive organic alkylating agent. The alkylating agent utilized in this example consists of butyl magnesium bromide. A reaction takes place between the Grignard agent and the halogenated surface of the silicon wafer. As a result of this reaction, an alkyl group (in this example a butyl group) is directly bonded to each silicon atom on the surface of the semiconductive silicon wafer. The wafer is subsequently washed, dried, and then leads are attached as described above in Example I.

*Example IV*

In this example, the semiconductive wafer consists of a monocrystalline germanium-silicon alloy. The wafer is activated by halogenation as described in Example I above, and is then immersed in a reactive organic alkylating agent. The alkylating agent utilized in this example consists of isopropyl magnesium bromide. A reaction takes place between the Grignard agent and the halogenated surface of the semiconductor wafer. As a result of this reaction, an isopropyl group is directly bonded to each atom on the surface of the semiconductor wafer. The subsequent steps of washing, drying, attaching electrical connections, and encapsulating the device are similar to that described in Example I.

What is claimed is:

1. A method of controlling the surface characteristics of a crystalline semiconductive wafer, said wafer consisting of a material selected from the group consisting of germanium, silicon, and germanium-silicon alloys, said method comprising the steps of halogenating the surface of said wafer, and then treating said wafer with a reactive alkylating agent.

2. A method of controlling the surface characteristics of a crystalline semiconductive wafer, said wafer consisting of a material selected from the group consisting of germanium, silicon, and germanium-silicon alloys, said method comprising the steps of halogenating the surface of said wafer, and then treating said wafer with a reactive alkylating agent until there is an approximately 1:1 ratio between the number of semiconductor atoms per unit of wafer surface area and the number of alkyl groups chemically bonded to said wafer per unit surface area.

3. The method of controlling the surface characteristics of a crystalline semiconductive wafer, said wafer consisting of a material selected from the group consisting of germanium, silicon, and germanium-silicon alloys, said method comprising the steps of halogenating the surface of said wafer, and then treating said wafer with an alkali metal alkyl reagent until there is an approximately 1:1 ratio between the number of semiconductor atoms per unit of wafer surface area and the number of alkyl groups bonded to said wafer per unit surface area.

4. The method of controlling the surface characteristics of a crystalline semiconductive wafer, said wafer consisting of a material selected from the group consisting of germanium, silicon, and germanium-silicon alloys, said method comprising the steps of chlorinating the surface of said wafer, and then treating said wafer with a lithium ethyl reagent until there is an approximately 1:1 ratio between the number of semiconductor atoms per unit of wafer surface area and the number of alkyl groups bonded to said wafer per unit surface area.

5. The method of controlling the surface characteristics of a crystalline semiconductive wafer, said wafer consisting of a material selected from the group consisting of germanium, silicon, and germanium-silicon alloys, said method comprising the steps of chlorinating the surface of said wafer, and then treating said wafer with lithium butyl reagent until there is an approximately 1:1 ratio between the number of semiconductor atoms per unit of wafer surface area and the number of alkyl groups bonded to said wafer per unit surface area.

6. The method of controlling the surface characteristics of a crystalline semiconductive wafer, said wafer consisting of a material selected from the group consisting of germanium, silicon, and germanium-silicon alloys, said method comprising the steps of chlorinating the surface of said wafer, and then treating said wafer with ethyl magnesium bromide until there is an approximately 1:1 ratio between the number of semiconductor atoms per unit of wafer surface area and the number of alkyl groups bonded to said wafer per unit surface area.

7. The method of controlling the surface characteristics of a crystalline semiconductive wafer, said wafer consisting of a material selected from the group consisting of germanium, silicon, and germanium-silicon alloys, said method comprising the steps of chlorinating the surface of said wafer, and then treating said wafer with butyl magnesium bromide until there is an approximately 1:1 ratio between the number of semiconductor atoms per unit of wafer surface area and the number of alkyl groups bonded to said wafer per unit surface area.

8. A composition of matter comprising a crystalline semiconductive wafer of material selected from the group consisting of germanium, silicon and germanium-silicon alloys, said wafer having alkyl groups chemically bonded to the semiconductor atoms on the surface of said wafer by means of a direct chemical bond between a carbon atom of said alkyl groups and said semiconductor atoms.

9. A composition of matter comprising a crystalline semiconductive wafer selected from the group consisting of germanium, silicon, and germanium-silicon alloys, said wafer having an alkyl group chemically bonded to each semiconductor atom on the surface of said wafer by means of a direct chemical bond between a carbon atom of said alkyl group and said semiconductor atom.

10. A composition of matter comprising a crystalline germanium semiconductive wafer having alkyl groups chemically bonded to the germanium atoms on the surface of said wafer by means of a direct chemical bond between a carbon atom of said alkyl groups and said germanium atoms, the ratio between the number of germanium atoms per unit of surface area and the number of alkyl groups bonded to said wafer per unit surface area being approximately 1:1.

11. A composition of matter comprising a crystalline germanium semiconductive wafer having ethyl groups chemically bonded to the germanium atoms on the surface of said wafer by means of a direct chemical bond between a carbon atom of said ethyl groups and said germanium atoms, the ratio between the number of germanium atoms per unit of surface area and the number of ethyl groups bonded to said wafer per unit surface area being approximately 1:1.

References Cited in the file of this patent

UNITED STATES PATENTS

| | | |
|---|---|---|
| 2,744,000 | Seiler | May 1, 1956 |
| 2,854,358 | Schwartz | Sept. 30, 1958 |
| 2,930,722 | Ligenza | Mar. 29, 1960 |